United States Patent

[11] 3,631,380

[72] Inventor Patrick A. Bohn
20115 Pacifica Drive, Cupertino, Calif. 95014

[21] Appl. No. 21,136
[22] Filed Mar. 19, 1970
[45] Patented Dec. 28, 1971

[54] UNIVERSAL CIRCUIT BOARD CONNECTOR
2 Claims, 6 Drawing Figs.

[52] U.S. Cl. .......... 339/156 R, 339/157 R, 339/17 LM, 339/17 M
[51] Int. Cl. .......... H05k 1/04
[50] Field of Search .......... 339/17 F, 17 L, 17 LC, 17 LM, 17 M, 176 MF, 176 MP, 156, 157, 159; 174/68.5; 317/101 CW, 101 D, 101 DH, 101 CX

[56] References Cited

UNITED STATES PATENTS

| | | | |
|---|---|---|---|
| 3,173,732 | 3/1965 | James .......... | 339/17 LM |
| 3,529,213 | 9/1970 | Farrand et al. .......... | 317/101 |
| 3,215,968 | 11/1965 | Herrmann .......... | 339/17 |
| 3,270,311 | 8/1966 | Deer et al. .......... | 339/17 |

FOREIGN PATENTS

| | | | |
|---|---|---|---|
| 1,064,896 | 4/1967 | Great Britain .......... | 339/176 MP |

*Primary Examiner*—Richard E. Moore
*Assistant Examiner*—Lawrence J. Staab
*Attorney*—A. C. Smith

ABSTRACT: A multiplane connector includes spaced contact elements on each of three orthogonally oriented surfaces and connection means of selected configuration on the fourth orthogonally oriented surface. A selected number of contact elements may be supported by an insulating body in laterally spaced relationship to provide a connector of predetermined length having such selected number of independent contact means for each surface.

INVENTOR
PATRICK A. BOHN
BY A. C. Smith
ATTORNEY

INVENTOR.
PATRICK A. BOHN

BY A. C. Smith

ATTORNEY

UNIVERSAL CIRCUIT BOARD CONNECTOR

BACKGROUND OF THE INVENTION

Printed circuit boards as the means for supporting and connecting a plurality of circuit elements have become widely accepted in the electronics industry and have contributed significantly to reductions in size and expense of electronic equipment. Printed circuit boards have also become widely accepted as circuit elements, for example, as read only memories, as reactive elements, and the like. In these and substantially all other uses of printed circuit boards, electrical connections must be made to the foillike conductors on the circuit board for supplying electrical power, input signals, and the like. However, since the foillike conductors are usually incapable of supporting themselves, electrical connections are usually made to the conductors at locations therealong that are backed or supported by the insulating circuit board. This typically requires a bulky connector which is disposed on both sides of the circuit board at an edge thereof for making contact to conductors that are brought out to the edge. Circuit board connections of this type are commonly known and have several disadvantages. Edge connections usually require that the conductors of a printed circuit board be brought out to the edge and this constitutes a loss of the available board area for laying out the printed circuit. Also, for high density of stacking and connecting of circuit boards, connections to the individual conductors on a circuit board must be made either by directly soldering wires thereto or by soldering wires to connector elements which, in turn, make mechanical-electrical connection to the conductors on a circuit board when the board is inserted into the connector. These conventional connection means for circuit boards thus increase the labor and handling costs and also decrease the circuit density potentially possible with circuit boards.

SUMMARY OF THE INVENTION

Accordingly, the connector of the present invention may be used to make contact with conductors on a circuit board along an edge or at any other location on the board. Also, the present connector may be used to provide interconnections between circuit boards, whether disposed in spaced, parallel relationship or in perpendicular relationship. Resilient contact elements provide three orthogonally disposed contact points which are laterally spaced in an insulating block. A fourth contact on each contact element has a selected configuration for attachment of wires thereto by wire-wrap or soldering techniques. Alternatively, this fourth contact on each contact element may have a configuration that is suitable for dip soldering to another circuit board or for contacting a flexible printed circuit cable.

DESCRIPTION OF THE PREFERRED EMBODIMENT

Figure 1:
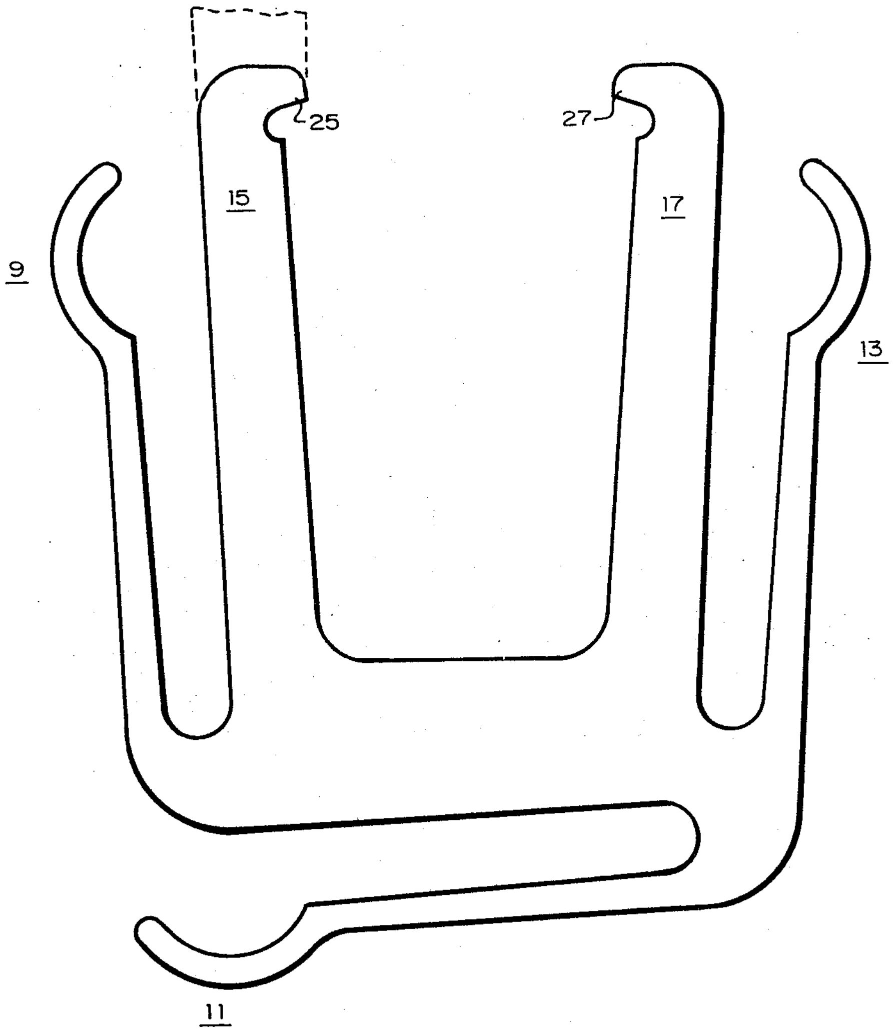
FIG. 1 is a plane view of the contact element of the circuit board connector of the present invention.
Figure 2A:
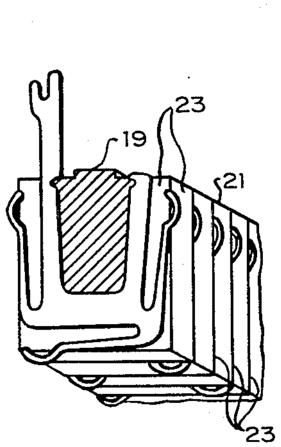
FIG. 2*a* through *c* are perspective sectional views of the present connector with contact elements of different connection configurations.
Figure 2B:
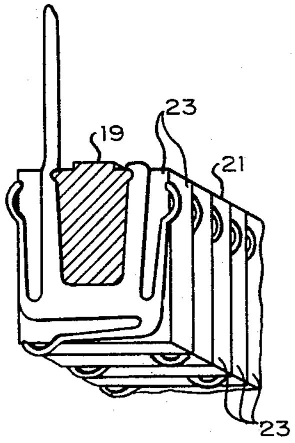
Figure 2C:
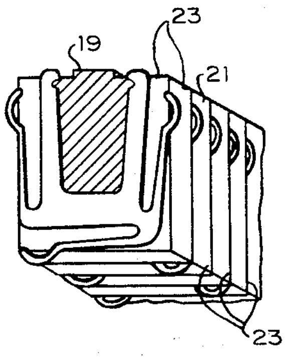

Referring now to FIG. 1, there is shown a plan view of the contact element of the present connector. Each such contact element includes resilient contact fingers 9, 11, 13 integrally formed thereon to protrude substantially in three orthogonal directions. The contact element may be stamped from flat-stock resilient conductor material such as beryllium-copper, or the like. The fourth contact configuration of the contact element is selected in accordance with the type of contact required to be made thereto. Thus, one leg 15 of the U-shaped central frame of the contact element may protrude and terminate in a conventional wire solder lug, as shown in FIG. 2*a*. Alternatively, this portion of the contact element may protrude in substantially straight-edged form to provide a wire-wrap terminal or dip solder lead, as shown in FIG. 2*b*. Also, where the contact element is used only as a junction connection between a plurality of circuit boards, both legs 15 and 17 of the U-shaped central frame may terminate in short lengths so that they do not protrude from the body of the connector, as shown in FIG. 2*c*.

In each of the embodiments shown in FIGS. 2*a*, *b*, and *c*, the U-shaped central frame of the contact element is disposed over a core section 19 of the body 21 of the present connector. These core sections constitute the root or base of each slot 23 in the surfaces of the body 21 and have a cross-sectional shape corresponding to the inner contour of the U-shaped central frame of the contact element. It should be noted that the lower ends of the legs 15, 17 of the U-shaped central frame include inwardly extending protrusions 25, 27 which are disposed to engage the lower edge of the core section and thereby retain the contact element in position about the core section 19 within a slot 23. This obviates the need for introducing holes in the body through which a contact element passes and also obviates the need for crimping or bending operations on the contact element to retain it in place on the body. Thus, the contact elements slip over the core sections 19 within the slots 23 and lock in place when properly inserted. The slots 23 may be disposed about the girth of the body at selected spacings along the body to provide a connector of any desired total length. The body with the slots 23 disposed therein may be cast of any suitable insulating material such as diallyl phthalate, polystyrene, Teflon, or the like, in a single operation.

Figure 3A:
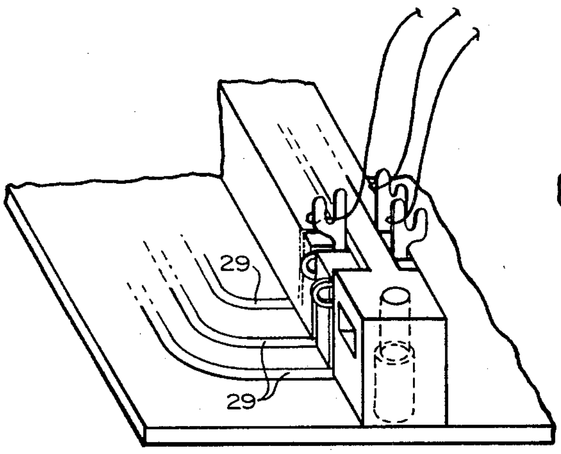
FIGS. 3*a* and *b* are sectional views of typical connection arrangements to circuit boards using the present connector.
Figure 3B:
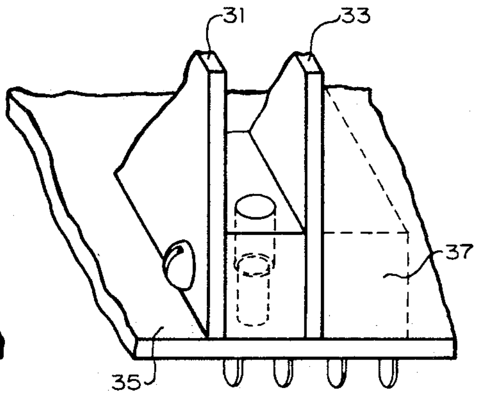

In use, the present connector may be arranged in several configurations as shown in FIG. 3. For example, the connector may have soldered wires attached thereto in preassembly and then be mounted on a circuit board, as shown in FIG. 3*a*, to establish pressure engagement of the contact fingers 11 (opposite the connection lugs on the legs of the U-shaped central frames) with the circuit board connectors 29. Similarly, the present connector may also be used to make contact to two plane-parallel circuit boards perpendicularly disposed in spaced relationship to a baseboard 35, as shown in FIG. 3*b*. In this case, the circuit boards 31 and 33 may be fastened against the side of the connector, or they may be held in position against a side of the present connector by a backing block (or another connector) 37 that is also mounted to the baseboard 35 in spaced location away from the connector. As shown in FIG. 3*b*, the configuration of the fourth contact per contact element may be a lineal postlike protrusion of selected length ideally suited for either wire-wrap attachment, dip-soldered attachment to the baseboard 35 or elevated standoff from the baseboard 35. The contacts remotely disposed from the fourth contacts may be positioned on alternate sides of center of the corresponding surface of the body, as shown in FIGS. 2 and 3, in order to equalize the resulting resilient forces on both sides of center of this surface when it is clamped to a circuit board. This also staggers the fourth contacts (as shown in FIG. 3 but omitted from FIG. 2 for clarity) to provide additional spacing between adjacent fourth contacts for convenience in servicing, wire harnessing, laying out of printed circuit conductors, and the like. Using typical dimensions of approximately 0.015 inch thick flat-stock material for the contact elements and typical spacing of about 0.015–0.025 inch between slots 23 in the body, it is readily possible to provide about 20 to 30 contact points per lineal inch of circuit board space on each of the four sides of the body of the present connector. This has the advantage of providing greater density of contact points than is possible using conventional connectors and also provides multisurface connections for increased stacking density of spaced, plane-parallel circuit boards and improved, versatile connection arrangements for rigid and flexible printed circuits.

I claim:

1. Circuit board connector apparatus comprising:

an insulating body having three substantially orthogonally oriented surfaces and a fourth substantially orthogonally oriented surface extending longitudinally along the length of the body;

said body including a plurality of recesses disposed in spaced relationship along the length of said body, each recess traversing the width of each of the three surfaces of said body to form a slot extending substantially continually about said three surfaces of the body and extending about the body at least partially in said fourth surface;

and for each of said recesses, a contact element having a continuous form which extends about the slot in the three surfaces and in at least a portion of the fourth surface for providing locking engagement of the contact element with the body to retain the contact element within the slot, the contact element having a substantially U-shaped continuous form which extends about the slot in said three surfaces and having resilient contact fingers integrally formed thereon along the longitudinal portions and the transverse portion of the U-shaped continuous form to protrude from the slot in directions including substantially normal components to the corresponding ones of said three surfaces and having connection means extending from only one of, and in substantial alignment with, said longitudinal portion of said U-shaped form.

2. Circuit board connector apparatus as in claim 1 wherein:

the contact fingers of the elements disposed in adjacent recesses along the length of said body that protrude from the one surface of said insulating body which is contiguous between and substantially orthogonally oriented with respect to the remaining two of said three surfaces are disposed to protrude at locations on said surface which are alternately on opposite sides of an axis substantially centrally disposed along the length of said surface.

* * * * *